(12) United States Patent
Ghosal et al.

(10) Patent No.: US 11,929,341 B2
(45) Date of Patent: Mar. 12, 2024

(54) NANO COPPER PASTE AND FILM FOR SINTERED DIE ATTACH AND SIMILAR APPLICATIONS

(71) Applicant: ALPHA ASSEMBLY SOLUTIONS INC., Waterbury, CT (US)

(72) Inventors: Shamik Ghosal, Waterbury, CT (US); Remya Chandran, Waterbury, CT (US); Venodh Manoharan, Waterbury, CT (US); Siuli Sarkar, Waterbury, CT (US); Bawa Singh, Waterbury, CT (US); Rahul Raut, Waterbury, CT (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 0 days.

(21) Appl. No.: 17/255,289

(22) PCT Filed: Jun. 21, 2019

(86) PCT No.: PCT/GB2019/051768
§ 371 (c)(1),
(2) Date: Dec. 22, 2020

(87) PCT Pub. No.: WO2020/002890
PCT Pub. Date: Jan. 2, 2020

(65) Prior Publication Data
US 2021/0162496 A1 Jun. 3, 2021

Related U.S. Application Data

(60) Provisional application No. 62/689,962, filed on Jun. 26, 2018.

(51) Int. Cl.
*B22F 1/102* (2022.01)
*B22F 1/052* (2022.01)
(Continued)

(52) U.S. Cl.
CPC ............. *H01L 24/29* (2013.01); *B22F 1/052* (2022.01); *B22F 1/07* (2022.01); *B22F 1/102* (2022.01);
(Continued)

(58) Field of Classification Search
None
See application file for complete search history.

(56) References Cited

U.S. PATENT DOCUMENTS 9,034,214 B2  5/2015  Kaneda et al.
10,392,535 B2  8/2019  Imai et al.
(Continued)

FOREIGN PATENT DOCUMENTS

JP   2010018832 A   1/2010
WO   2004/039524 A1  5/2004
(Continued)

OTHER PUBLICATIONS

Cheng Chaoliang et al., "A novel method of synthesizing antioxidative copper nanoparticles for high performance conductive ink", Journal of Materials Science. Materials in Electronics, Chapman and Hall, May 26, 2017, vol. 28, No. 18, London, GB abstract; 2.2, 4; Conclusions; figure 2.

(Continued)

*Primary Examiner* — George Wyszomierski
(74) *Attorney, Agent, or Firm* — Stinson LLP

(57) ABSTRACT

A sintering powder comprising copper particles, wherein: the particles are at least partially coated with a capping agent, and the particles exhibit a D10 of greater than or equal to 100 nm and a D90 of less than or equal to 2000 nm.

8 Claims, 4 Drawing Sheets

(51) Int. Cl.
*B22F 1/07* (2022.01)
*B22F 5/00* (2006.01)
*B22F 9/24* (2006.01)
*B23K 35/02* (2006.01)
*B23K 35/30* (2006.01)
*H01L 23/00* (2006.01)
*B82Y 40/00* (2011.01)

(52) U.S. Cl.
CPC ............... *B22F 5/006* (2013.01); *B22F 9/24* (2013.01); *B23K 35/025* (2013.01); *B23K 35/302* (2013.01); *B22F 2301/10* (2013.01); *B22F 2304/054* (2013.01); *B22F 2304/056* (2013.01); *B22F 2304/058* (2013.01); *B82Y 40/00* (2013.01)

(56) References Cited

U.S. PATENT DOCUMENTS

| | | | | |
|---|---|---|---|---|
| 2004/0069454 | A1* | 4/2004 | Bonsignore | B82Y 30/00 |
| | | | | 165/104.16 |
| 2006/0090597 | A1 | 5/2006 | Goia et al. | |
| 2014/0203222 | A1 | 7/2014 | Chiho et al. | |
| 2014/0367619 | A1* | 12/2014 | Summers | B05D 5/12 |
| | | | | 427/532 |
| 2015/0266090 | A1* | 9/2015 | Kamikoriyama | H01B 1/026 |
| | | | | 252/512 |
| 2016/0365323 | A1* | 12/2016 | Viswanathan | H01L 24/03 |
| 2017/0028477 | A1* | 2/2017 | Setna | C09J 11/04 |
| 2018/0061520 | A1* | 3/2018 | Kajita | H01L 24/83 |
| 2018/0079001 | A1* | 3/2018 | Kamikoriyama | B22F 1/107 |
| 2018/0163069 | A1* | 6/2018 | Wakita | C09D 7/62 |
| 2020/0266170 | A1* | 8/2020 | Takahashi | H01L 24/29 |

FOREIGN PATENT DOCUMENTS

| | | |
|---|---|---|
| WO | 2014/068299 A1 | 5/2014 |
| WO | 2015/155542 A1 | 10/2015 |

OTHER PUBLICATIONS

Kong Dal Sung et al., "Influence of annealing atmosphere on the electrical conductivity of copper nanoparticle films", Electronic Materials Letters, Daehan Geumsog Jae'lyo Haghoe, KR, May 10, 2016, vol. 12, No. 3 abstract; 2. Experimental procedure.

Huang Hai-Jun et al., "Fabrication of oxidation-resistant submicron copper particles and the conductive ink as well as its sintering behavior on the flexible substrate", 2018 19th International Conference on Electronic Packaging Technology, Aug. 8, 2018, pp. 491-495 abstract; figure 1.

\* cited by examiner

NANO COPPER PASTE AND FILM FOR SINTERED DIE ATTACH AND SIMILAR APPLICATIONS

The invention relates to a sintering powder, sintering paste and sintering film.

Sintered joints provide an alternative to soldered joints. A typical method of forming a sintered joint involves placing a metal powder, often in the form of a powder compact, between two work pieces to be joined and then sintering the metal powder. The resulting atomic diffusion of the metal atoms forms a bond between the two work pieces.

Metal nanopowders have been used to form sintered joints in the electronics industry, and are considered to be useful alternatives to lead-free soldering. The differing behaviour between nanomaterials and the corresponding bulk material is thought to be due to nanomaterials having a higher surface-area-to-volume ratio. The formation of a conductive joint between two materials by use of metal nanoparticles has many benefits when compared with the traditional solder paste, in terms of its mechanical, electrical and thermal reliability.

Sintering powders containing silver nanoparticles are known. Sintered joints formed by atomic diffusion of silver nanoparticles can be processed at a temperature significantly lower than the melting temperature of the bulk and can also be used for high temperature applications. However, the sintering temperatures of such sintering powders are still too high for effective use in most electronics applications.

Sintering temperatures may be reduced by applying an external pressure during sintering. Pressure-assisted low-temperature sintering of silver paste has been shown to be a viable alternative to solder reflow as a die-attachment method. The application of high pressure has been shown to significantly lower the sintering temperature, and the desired properties for die attachment can be achieved at a relatively faster rate resulting in the formation of a sintered joint within a few minutes. However, a large external pressure makes automation of the process difficult. Furthermore, application of a large external pressure may result in damage to the work pieces.

Silver metal, due to its excellent electrical and thermal conductivity, has long been used in the electronics industries for die attach applications. However, the high cost of silver limits the wide spread application of silver in many areas. Moreover, silver also faces the issue of ion migration at relatively high temperature and humidity, which is the other major cause of concern.

Copper is a much cheaper material in comparison to silver and also possesses a very high conductivity (only 6% less than that of Ag). In addition to its lower cost, copper also does not exhibit the problem of ion migration which gives copper an edge over silver. However, the inherent tendency of copper nanoparticles to oxidize is still a major problem.

There have been several reports presenting various approaches which demonstrate that copper nanoparticles can resist oxidation under ambient conditions if they are coated by a proper protective layer. The utility of these copper nanoparticles in a conductive die attach paste for die attach application is still very much unexplored. Hence, in the electronics market, there is a huge demand for a copper die attach paste which can give almost the same benefits of nanosilver, but at a much lower cost.

WO 2014/068299 relates to a sintering powder comprising a particulate having a mean longest diameter of less than 10 microns and is directed at silver nanoparticles with a bimodal particle size distribution. WO 2015/155542 relates to a low pressure sintering powder and is also directed at silver nanoparticles with a bimodal particle size distribution. Since both documents make use of silver, the problem of ion migration may occur.

The present invention seeks to tackle at least some of the problems associated with the prior art or at least to provide a commercially acceptable alternative solution thereto.

In a first aspect, the present invention provides a sintering powder comprising copper particles, wherein:
the particles are at least partially coated with a capping agent, and
the particles exhibit a D10 of greater than or equal to 100 nm and a D90 of less than or equal to 2000 nm.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

The inventors have surprisingly found that the sintering powder exhibits advantageous sintering properties while also being less prone to oxidation than conventional copper-containing sintering powders.

Advantageously, the sintering powder provides equal or similar benefits of nanosilver in terms of sinterability, thermal conductivity, electrical conductivity and favourable mechanical properties of the final joint, but at a much lower cost. In addition, the problem of ion migration associated with nanosilver is overcome.

The sintering powder is typically air stable and non-agglomerated.

Furthermore, the sintering powder enables the versatile joining of surfaces and in particular, the versatile joining of two or more surfaces of different finishes, such as: copper-to-copper; copper-to-aluminium; aluminium-to-copper; aluminium-to-aluminium; and copper-to-nickel. The sintering powder is particularly suitable for die attach.

The term "sintering powder" as used herein may encompass a powder capable of forming a sintered joint. Sintered joints are formed by atomic diffusion of metal particles placed between two work pieces to be joined. The term "sintering powder" may encompass a particulate.

The sintering powder comprises copper particles. The particles may comprise regular shaped particles (such as, for example, spheres) and/or irregular shaped particles (such as, for example, whiskers, plates, rods or flakes).

The copper particles may be in the form of, for example, copper metal or copper alloy, preferably copper metal.

The sintering powder may comprise particles other than copper particles. However, the majority of the particles in the sintering powder are copper particles, typically substantially all of the particles copper are copper particles.

The particles are at least partially coated with a capping agent. The term "capping agent" as used herein may encompass a species that, when present on the surface of metal particles, reduces agglomeration of the metal particles, enables particle size control during powder production and reduces particles' surface oxidation or other contamination. Advantageously, the use of a capping agent may help to reduce agglomeration of the particles. Such agglomeration is unfavourable, since it may increase the sintering temperature of the sintering powder. Accordingly, the use of a capping agent enables the formation of a sintered joint between work pieces at lower temperatures and, therefore, may help to reduce damage to a work piece caused by exposure to high sintering temperatures. In addition, the use of a capping agent may help to avoid degradation of the metal such as, for example, damage caused by exposure of the metal to air.

The particles are typically substantially coated with the capping agent, more typically completely coated with the capping agent.

The particles exhibit a D10 of greater than or equal to 100 nm and a D90 of less than or equal to 2000 nm. D90 describes the diameter where 90% of the distribution has a smaller particle size and 10% has a larger particle size. The D10 diameter has 10% smaller and 90% larger. As is conventional in the art, the diameter corresponds to the equivalent spherical diameter, and the distribution corresponds to a volume distribution. The D10 and D90 may be measured by suitable techniques known in the art such as, for example, laser diffraction, dynamic light scattering and SEM image analysis.

Particles smaller than 100 nm may be more prone to oxidation. Particles larger than 2000 nm may not exhibit advantageous sintering properties, such as good sinterability and a reduced sintering temperature in comparison to the bulk. Accordingly, the sintering power exhibits favourable sintering properties while being capable of being produced, stored, handled and used under non-inert atmospheres, such as air. The D90 is preferably less than or equal to 1000 nm, more preferably less than or equal to 500 nm, even more preferably less than or equal to 450 nm, still even more preferably less than or equal to 400 nm. A lower D90 value may improve the advantageous sintering properties. The D10 is preferably greater than or equal to 125 nm, more preferably greater than or equal to 150 nm. A larger D10 value may improve the resistance to oxidation. Preferably, the particles exhibit a D10 of greater than or equal to 125 nm and a D90 of less than or equal to 450 nm, more preferably the particles exhibit a D10 of greater than or equal to 150 nm and a D90 of less than or equal to 400 nm.

The particle size distribution is typically unimodal.

Preferably, the sintering powder is for die attach. The sintering powder may be particularly effective for use in die attach.

The capping agent may be inorganic and/or organic. Examples of organic capping agents include polymers and ligands. Preferably the capping agent comprises an amine and/or a carboxylate functional group. Such capping agents may form a weak bond with the metal particles. Accordingly, the temperature required to break the bonding may be reduced, which may help to reduce the sintering temperature. Capping agents that comprise an amine functional group are particularly preferred in this regard. Preferably, the capping agent comprises triethanol amine and more preferably, the capping agent is triethanol amine. Triethanol amine is a particularly effective at reducing agglomeration and/or oxidation of the particles without adversely affecting the favourable sintering properties.

The sintering powder preferably comprises up to 1 wt. % capping agent, more preferably from 0.1 to 0.5 wt. % capping agent, even more preferably from 0.2 to 0.4 wt. % capping agent. Lower levels of capping agent may result in unfavourable agglomeration or render the particle more prone to oxidation. Higher levels of capping gent may result in higher levels of residual capping agent being present in a sintered joint formed using the capping agent. This may reduce the mechanical properties, in particular the die shear strength, of the joint. Since the particles have a larger particle size that conventional sintering powders, the amount of capping agent required to reduce agglomeration and/or to provide suitable oxidation resistance is less than for conventional sintering powders. This may improve the mechanical properties of a sintered jointed formed by using the sintering powder, since the amount of residual capping agent present in the sintered joint will be less.

The sintering powder may advantageously be in the form of a powder compact. This may make it easier to position the sintering powder in the required location of the desired sintered joint.

In a further aspect, there is provided a sintering paste comprising the sintering powder as described herein.

The sintering paste provides almost all of the same benefits as nanosilver paste, but with a much lower cost. The sintering paste demonstrates excellent thermal and electrical conductivity. For example, the sintering paste typically exhibits an electrical conductivity of at least $1.0 \times 10^6$ S/m, more typically at least $1.5 \times 10^6$ S/m, for example about $1.8 \times 10^6$ S/m. Advantageously, the paste is stable under ambient room conditions.

The paste may be printable and/or dispensable and/or jettable and/or pin transferable and/or screen printable. The paste may have viscosity and flow characteristics particularly favourable for dispensing, meaning that the paste may be used as a one-to-one replacement for solders.

The sintering paste may further comprise one or more of, for example, a binder, an activator, a dispersing agent, and an organic solvent. These components are typically selected so that they are able to be removed from the paste (for example by evaporation and/or burn out) at a temperature below the targeted sintering temperature of the sintering powder. This may help to promote near complete sintering of the metal particles. When organic material remains in the joint during sintering, inadequate sintering of the metal particles may occur. This may result in a weak sintered joint.

Preferably, the paste comprises 70 to 90 wt. % of the sintering powder, more preferably from 70 to 87 wt %. This may allow an advantageous combination of favourable sintering properties and handling properties.

The paste preferably comprises 1 to 5 wt. % of a binder. The binder may serve to bind the paste together so that it is easier to handle and position accurately in the location of a desired sintered joint.

The binder preferably comprises a polymer. Polymers suitable for use as a binder are known in the art. Preferably the binder comprises an epoxy-based resin, more preferably an epoxy methacrylate urethane. Epoxy-based resin may be particularly effective at binding the paste together so that the paste is easier to handle and may be easier to position accurately in the location of a desired sintered joint. Furthermore, the use of epoxy resin may result in the formation of a stronger joint prior to sintering, meaning that there is no requirement to hold together the work pieces to be joined prior to sintering. The use of epoxy resin is particularly advantageous when the capping agent comprises an amine functional group. In this case, the amine acts as a hardener forming a cross-linked structure. This may result in a particularly strong joint prior to sintering.

The paste preferably comprises 0.5 to 3 wt. % of an activator, more preferably from 1 to 3 wt. %. An activator may be added to remove any metal oxide that may be present from the surface being printed and/or to remove any oxides that may be present in the sintering powder. Aryl or alkyl carboxylic acids may be used as activators. Preferably the activator comprises a dicarboxylic acid, more preferably malonic acid.

The paste preferably comprises 0.5 to 2 wt. % of a dispersing agent. The dispersing agent typically comprises a surfactant. A dispersing agent/surfactant may be added to the sintering paste to help disperse the sintering powder in the sintering paste. An example of a particularly suitable commercially available dispersing agent/surfactant is BYK 163.

The paste preferably comprises 10 to 15 wt. % of an organic solvent. The organic solvent preferably comprises a monoterpene alcohol (e.g. terpineol) and/or a glycol (e.g. triethylene glycol) and/or glycol ether. Monoterpene alcohol and/or a glycol may be particularly effective at dispersing the metal particles within the paste, resulting in a homogeneous distribution of metal particles in the matrix of organic components with reduced cluster aggregation and/or agglomeration. The use of monoterpene alcohol and/or a glycol may serve to increase the flow-ability and printer-ability of the sintering paste. The organic solvent preferably comprises terpineol as a particularly effective solvent The sintering paste may comprise further species. For example, a rheology modifier may be added to control the viscosity of the paste. Examples of suitable rheology modifiers include, but are not restricted to, Thixcin R and Crayvallac Super.

In a particularly preferred embodiment, the paste comprises:

70 to 90 wt. % of the sintering powder,
1 to 3 wt. % of an activator,
0.5 to 2 wt. % of a dispersing agent,
10 to 15 wt. % of an organic solvent, and
optionally, 1 to 5 wt. % of a binder.

The paste is preferably printable and/or dispensable and/or jettable and/or pin transferable and/or screen printable.

In a further aspect, the present invention provides a sintering film comprising the sintering paste described herein.

In one preferred embodiment, the film is pre-applied to a wafer. In another preferred embodiment, the film is on a polymer substrate. In another preferred embodiment, the film is free standing.

In a further aspect, the present invention provides a method of manufacturing a sintering powder, the method comprising:

providing a solution comprising copper ions and a capping agent,
contacting the solution with a reducing agent to provide the sintering powder, and
recovering the sintering powder.

The method results in a sintering powder comprising copper particles. The method results in a sintering powder comprising copper particles with a favourably narrow particle size distribution, typically with a D10 of greater than or equal to 100 nm and a D90 of less than or equal to 500 nm. The resulting sintering powder may be particularly suitable for use as a sintering powder, for example for die attach, and may exhibit improved oxidation resistance in comparison to conventional copper sintering powders. The resulting sintering powder may be the sintering powder described herein. The advantages and preferable features of the method of the following aspect of the present invention apply equally to this aspect.

In a further aspect, the present invention provides a method of manufacturing the sintering powder described herein, comprising:

providing a solution comprising copper ions and a capping agent,
contacting the solution with a reducing agent to provide the sintering powder, and
recovering the sintering powder.

Since the sintering power exhibits resistance to oxidation, advantageously the method may be carried out in a non-inert atmosphere such as, for example, air.

The copper ions and capping agent may be added sequentially to the solvent to form the solution, or simultaneously. Typically, capping agent is added dropwise to a solution of copper ions under vigorous stirring. This may ensure that the capping agent is finely dispersed in the solution, thereby helping to control the particle size to be in the desired range.

The solution is preferably an aqueous solution such as, for example, demineralised water.

The solution and reducing agent are typically contacted by mixing and stirring. During this step, the particles of the sintering powder precipitate out of solution.

The molar ratio of copper ions: capping agent in the solution is preferably from 1:1 to 10:1, more preferably from 2:1 to 7:1, even more preferably from 4:1 to 6:1.

Such ratios may help to provide the particles in the desired size. For example, higher amounts of capping agent may result in the formation of undesirably small particles, whereas lower amounts of capping agent may result in the formation of undesirably large particles.

The copper ions in the solution are preferably provided in the form of a copper salt. The copper salt preferably comprises copper acetate. Copper acetate is a particularly suitable salt and is low cost.

The capping agent preferably comprises triethanol amine.

The solution preferably has a pH greater than 7. A pH greater than 7 may be achieved, for example, by adding hydroxide ions to the solution, for example by the addition of NaOH and/or KOH. A pH greater than 7 may provide more favourable conditions for reduction, thereby increasing the yield. Furthermore, a pH greater than 7 may avoid any unfavourable reaction of copper particles with acid.

The molar ratio of reducing agent to copper ions is preferably greater than 1:1. An excess of reducing agent may increase the yield.

The reducing agent preferably comprises hydrazine (e.g. hydrazine hydrate). Hydrazine is a particularly suitable reducing agent, and is particularly effective at producing the particles in the required size range.

The solution comprising copper ions and a capping agent is preferably contacted with the reducing agent for from 5 to 30 hours, preferably from 10 to 20 hours. Shorter times may result in a reduced yield and/or the formation of unfavourably small particles. Longer times may result in the formation of unfavourably large particles.

The recovering typically comprises one or more of decanting the resulting solution ("mother liquor") from the sintering powder, washing the sintering powder and drying the sintering powder. Washing may be carried out with, for example, water followed by acetone. Drying may be carried out, for example, at a temperature in excess of 30° C., for example 35° C.

The method is preferably carried out in a non-inert atmosphere, such as air. This is in contrast to methods of preparing conventional copper sintering powders, which are susceptible to oxidation. Carrying out the method in a non-inert atmosphere may decrease the complexity and/or cost of the method.

In a further aspect, the present invention provides a method of manufacturing the sintering paste described herein, the method comprising:

providing the sintering powder described herein, and
mixing the sintering powder with an organic solvent and optionally one or more of an activator, a dispersing agent, a capping agent and a binder.

The method preferably further comprises milling the sintering paste, for example in a three-roll mill. This may improve the homogeneity of the paste. The addition of additional capping agent during the mixing step prior to milling may reduce the occurrence of agglomeration during milling.

The method preferably further comprises casting the sintering paste into a film. Suitable casting methods are known in the art.

In a further aspect, the present invention provides a method of forming a joint between two or more work pieces, the method comprising:
provide two or more work pieces to be joined,
providing the sintering powder described herein and/or the sintering paste described herein and/or the sintering film described herein in the vicinity of the two or more work pieces,
drying the sintering powder and/or sintering paste and/or sintering film, and
heating the sintering powder and/or sintering paste and/or sintering film to at least partially sinter the metal.

In a preferred embodiment, the two or more work pieces comprise a die and a substrate.

The drying step is carried out prior to the heating step. The drying step may enable subsequent pressure to be applied during sintering without dis-lodging ("squeezing out") the powder, paste or film. The drying step is also advantageous for "pressure-less sintering", where it serves to prevent any dis-lodging during the heating step.

The drying is preferably carried out at a temperature of from 30 to 100° C., more preferably from 40 to 80° C., even more preferably from 50 to 70° C. The drying is preferably carried out for from 1 to 60 minutes, more preferably from 5 to 40 minutes, even more preferably from 10 to 30 minutes.

The at least partial sintering results in the formation of the joint. The heating typically results in substantial sintering of the metal, more typically complete sintering of the metal. The heating is preferably carried out at a temperature of from 140 to 300° C., more preferably from 180 to 280° C. The heating is preferably carried out for up to 15 minutes, more preferably from 1 to 8 minutes, even more preferably from 2 to 6 minutes. Lower temperatures and shorter heating times may result in incomplete sintering, thereby resulting in unfavourable mechanical and/or thermal and/or electrical properties of the final joint. Higher temperature and longer heating times may result in damage to the work pieces.

The heating may be carried out under pressure or without pressure (so-called "pressure-less sintering"). When the heating is carried out under pressure, preferably a pressure of from 2 to 18 MPa is applied during the heating, more preferably from 3 to 15 MPa, even more preferably from 5 to 13 MPa, still even more preferably from 8 to 12 MPa. Higher pressures may advantageously require a lower heating temperature and/or result in the formation of a joint with more favourable mechanical and/or thermal and/or electrical properties due to improved inter-particle contact. However, if the pressure is too high, then there is a risk of damage to the work pieces.

In a preferred embodiment:
the sintering paste is screen-printed onto one or more of the work pieces to be joined to form a screen-printed pattern; and
solder is applied to the screen-printed pattern,
optionally wherein the screen-printed pattern is coated by an electroless nickel immersion gold (ENIG) technique prior to the solder being applied.

Suitable techniques for screen-printing are known in the art. The screen-printing may be carried out using, for example, a mesh screen (e.g. mesh size 70). The screen-printing is carried out during the step of providing the sintering paste in the vicinity of the two or more work pieces. Solder may be applied using, for example, standard solder paste. As a result of the sintering paste, the soldering may exhibit a favourable spread and soldering features. The soldering and ENIG are typically carried out after the drying step and the heating step.

The screen-printed pattern is optionally coated by an electroless nickel immersion gold (ENIG) technique prior to the solder being applied. Suitable electroless nickel immersion gold techniques are known in the art. Electroless nickel immersion gold (ENIG) is a type of surface plating used for printed circuit boards. It consists of an electroless nickel plating covered with a thin layer of immersion gold, which protects the nickel from oxidation. ENIG has several advantages over more conventional (and cheaper) surface platings such as HASL (solder), including excellent surface planarity (particularly helpful for PCBs with large BGA packages), good oxidation resistance, and usability for untreated contact surfaces such as membrane switches and contact points.

The two or more work pieces preferably comprise a semiconductor or other die element and a substrate. The substrate may comprise, for example, DBC (Direct Bond Copper). DPC (Direct Plate Copper), MCPCB (Metal Core PCBs), FR4, Copper lead-frames, flexible PCBs.

In a typical process, the powder and/or paste and/or film is placed or screen-printed on the substrate and is then dried. This is then typically followed by die placement via, for example, a die bonder or a pick and place machine. Heating is then typically carried out using, for example, a Carver press. Soldering and optionally ENIG are then typically carried out thereafter.

In a further aspect, the present invention provides use of the sintering powder described herein and/or the sintering paste described herein and/or the film described herein in a method selected from: die attachment, wafer-to-wafer bonding, hermetic and near hermetic sealing, sintering films comprising a sintering powder and a binder formed in a film on a backing layer, dispensing and the production of interconnect lines.

In a further aspect, the present invention provides a sintered joint formed using the sintering powder described herein, and/or the sintering paste described herein, and/or the sintering film described herein.

The sintered joint may exhibit a high shear strength in comparison to joints formed using conventional sintering powders.

The invention will be described in relation to the following non-limiting drawings in which.

Figure 1:
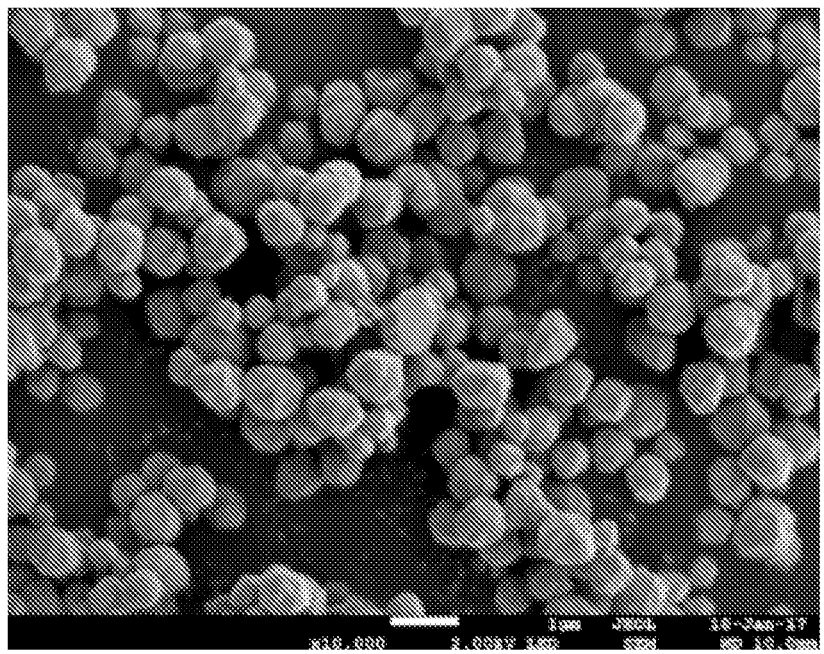
FIG. 1 shows an FESEM image of a synthesised copper powder according to the invention (×10,000).

The invention will now be described in relation to the following non-limiting examples.

The materials used in the following Examples were purchased as follows: copper (II) acetate monohydrate was purchased from Fischer Scientific; triethanolamine (85%) was purchased from ViVochem; sodium hydroxide, hydrazine (85% LR), methanol and acetone were purchased from SDFCL; and demineralised water was purchased from Spectrum Chemicals.

The equipment used in the following Examples was as follows: die shear was performed on Dage4000 PXY; film was casted on Pro-cast tape caster (TC-71LC); and sintering was done using Carver press (3891CEB.4NE1001).

Example 1

Synthesis of Copper Nanoparticles

Cupric acetate (100 g) was dissolved in demineralized water (1500 ml). To the aqueous solution of cupric acetate, triethanolamine (20 g) was added dropwise with vigorous stirring and the solution was then stirred for 30 minutes. Potassium hydroxide/sodium hydroxide (20 g potassium hydroxide in 100 ml water) was then added to make the solution basic (pH>7) and the solution was allowed to stir for a further 30 minutes. To this mixture, excess hydrazine hydrate solution (150 ml) was added via a dropping funnel. As the reaction is very exothermic and emits effervescence, precaution should be taken. Hence, the reaction was carried out in a water bath where the temperature of the reaction was maintained between 20 and 25° C. The resulting solution was then stirred for 6 hours. The colour of the reaction mixture changed from bluish green to orange and then finally to a light brown colour. The solution was then allowed to stand for 1 hour so that the synthesized copper particles were allowed to settle at the bottom and the resulting solution (mother liquor) was then decanted. The synthesized powder was then washed thoroughly with excess water to remove the unwanted reactants. The washed powder then washed with acetone. The powder was dried at 35° C.

Figure 2:
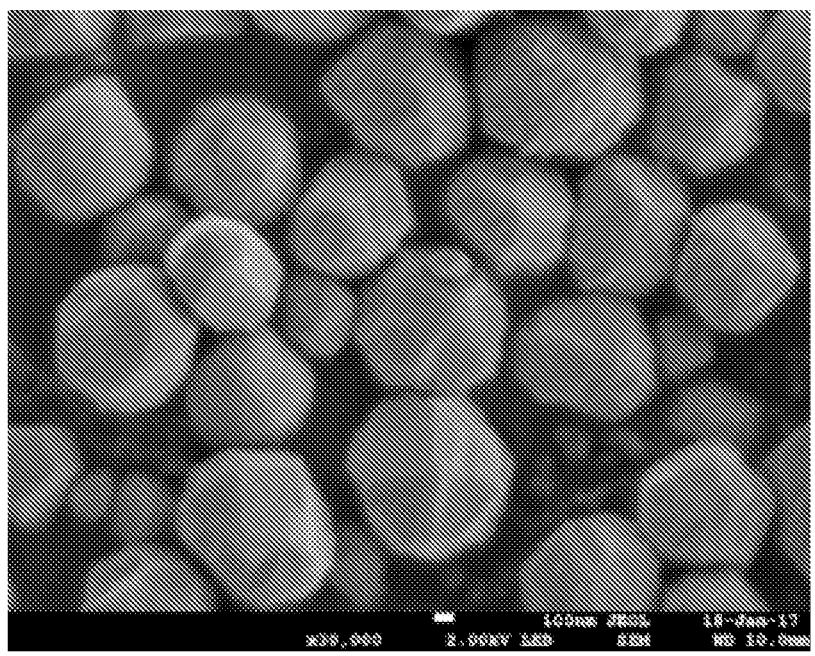
FIG. 2 shows an FESEM image of a synthesised copper powder according to the invention (×30,000).

The synthesized powder was then characterised by powder scanning electron microscopy (SEM) and powder X-ray diffraction (XRD). The D10 by image analysis was greater than or equal to 100 nm and the D90 was less than or equal to 500 nm. FIGS. 1 and 2 show field emission scanning electron microscopy (FESEM) images of the synthesised particles. FESEM shows that the particles have a distinct shape and have a narrow particle size distribution, ranging from 200 to 400 nm. Not wishing to be bound by theory, it is considered that the larger size of the copper nanoparticles makes them more resistant towards oxidation in comparison to copper nanoparticles in conventional sintering powders.

The particle sizes were also determined using a particle size analyser (PSA), which showed a very consistent and narrow size distribution ranging between 150 and 350 nm, in conformity with SEM.

Example 2

Preparation of Copper Nanopaste

Example 2.1

The above-synthesized nano copper powder (24 g) was dispersed with epoxy methacrylate urethane (0.279 g) using a high-speed mixer (1000 rpm, 1 minute). To the dispersion, triethanolamine (85%, 0.279 g), BYK 163 (0.558 g), malonic acid (1.116 g) and terpineol (1.674 g) were added and blended using a high speed mixer at 1000 rpm for 1 minute. The resulting mixture was then milled thoroughly using the EXAKT three roll mill. The collected homogeneous printable paste was then stored under standard temperature and pressure (STP).

Example 2.2

The above-synthesized nano copper powder (15 g) was dispersed with epoxy methacrylate urethane (0.70 g) using high-speed orbital mixer. To the dispersion, BYK (0.70 g) was added. A methanol solution of malonic acid (1.41 g of malonic acid in 1.41 g of methanol) was added to the dispersion followed by the addition of terpineol (1.5 g). The mixture was then put in high-speed orbital mixture and milled in a three-roll mill for few minutes to provide a homogenous paste.

Example 2.3

The above-synthesized nano copper powder (15 g) was dispersed with epoxy methacrylate urethane (0.754 g) using high-speed orbital mixer. To the dispersion, BYK (0.754 g) was added. Malonic acid (1.51 g) was added to the dispersion followed by the addition terpineol (2.64 g). The mixture was then put in high-speed orbital mixture and milled in a three-roll mill for few minutes to provide a homogenous paste.

Example 2.4

The above-synthesized nano copper powder (15 g) was dispersed with epoxy methacrylate urethane (0.754 g) using high-speed orbital mixer. To the dispersion, BYK (0.754 g) was added. Malonic acid (1.51 g) was added to the dispersion followed by the addition of formic acid (1.511 g) and terpineol (2.64 g). The mixture was then put in high-speed orbital mixture and milled in a three-roll mill for few minutes to provide a homogenous paste.

The electrical conductivity of the above-synthesized copper pastes was about $1.8 \times 10^6$ S/m.

Example 3

Process of Film Casting

The copper paste was casted on polyethylene terephthalate (PET) film with the help of a tape caster. The thickness of the film was set at 75 μm. The copper paste was passed through the tape caster at 100° C. The casting time of the film was around 25 minutes. The thickness of the casted film was around 50 to 60 μm.

Example 4

Film Transfer on Die Process

A film transfer on die (DTF) process was implemented using Datacon die bonder. The stamping conditions for 3 mm*3 mm gold coated silicon dies were as follows in Table 1:

TABLE 1

| Stamping pressure (MPa) | Stamping temperature (° C.) | Stamping time (s) |
|---|---|---|
| 5 | 200-225 | 1-10 |

The film was fully transferred onto the die side with no remains of the copper film onto the PET substrate. The copper-coated Si die was then attached to gold/copper coated direct bond copper (DBC) using a Tresky die bonder under the following conditions in Table 2:

TABLE 2

| Stamping pressure (MPa) | Stamping temperature (° C.) | Stamping time (s) |
|---|---|---|
| 5-10 | 300 | 100 |

Figure 3:
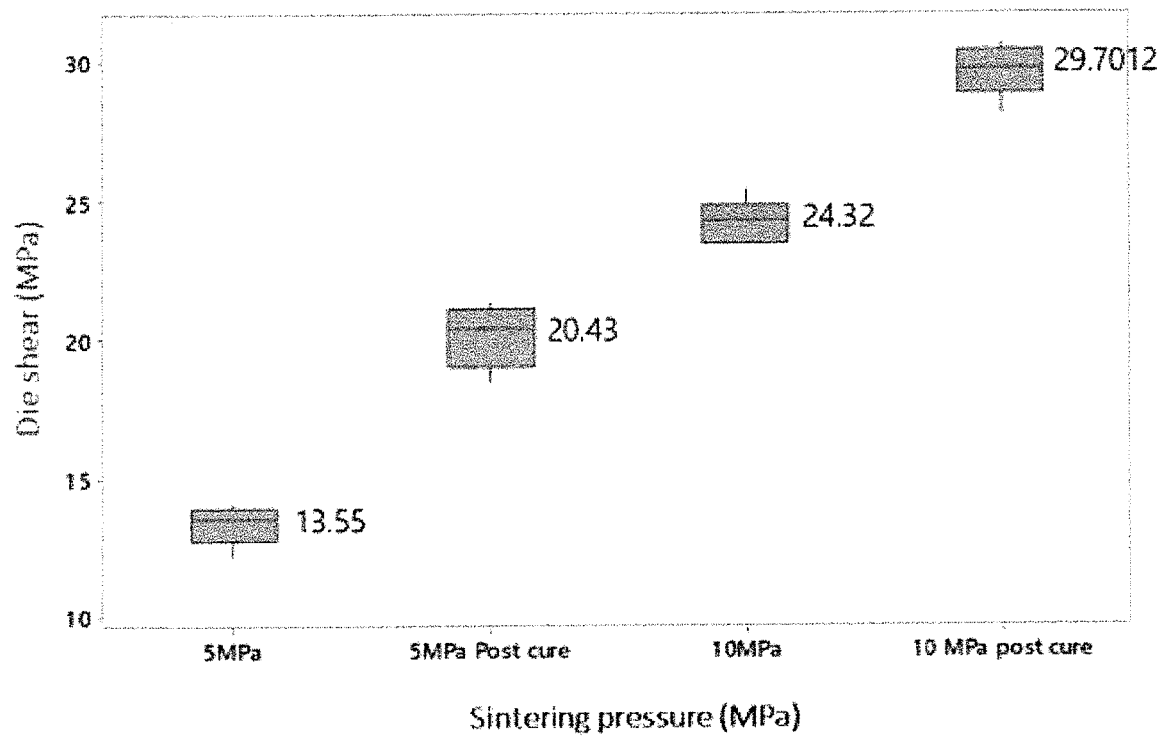
FIG. 3 shows boxplots of die shear at 5 and 10 MPa pressure and the effect of post cure.

Die shear obtained from the above conditions is shown in FIG. 3. In FIG. 3, the post curing conditions were at a temperature of 300° C. for 30 minutes. The die shears at 5 MPa sintering pressure, with and without post cure, were about 14 MPa and about 20 MPa, respectively. The die shears at 10 MPa sintering pressure, with and without post cure, were about 24 MPa and about 30 MPa, respectively. It can be clearly seen that there is a drastic increase in joint strength when the vehicle is post cured at 300° C. for 30 minutes. The failure mode was a bulk failure irrespective of the conditions being used.

Example 5

Wafer Lamination for 2 Inch Silicon Gold Plated Wafer Using Carver Press

Both of the platens of the Carver press were kept at 175° C. Lamination of the silicon wafer was done by using 5 to 10 MPa pressure. Silicon rubber was used as a cushion effect for laminating. The dwell time for the lamination is around 3 minutes. The stamped portion of the film showed no remains of the film on the PET sheet. The laminated wafer was then mounted on UV tape and diced using a dicing machine.

The diced 3 mm*3 mm die was then attached to Au/Cu coated DBC using Carver press. A joint strength of around 30 to 32 MPa was achieved when the sintering pressure was 5 MPa. Whereas, a joint strength of 40 MPa was achieved when the sintering pressure was around 10 MPa at 250° C. for 3 minutes dwell time.

Figure 4:
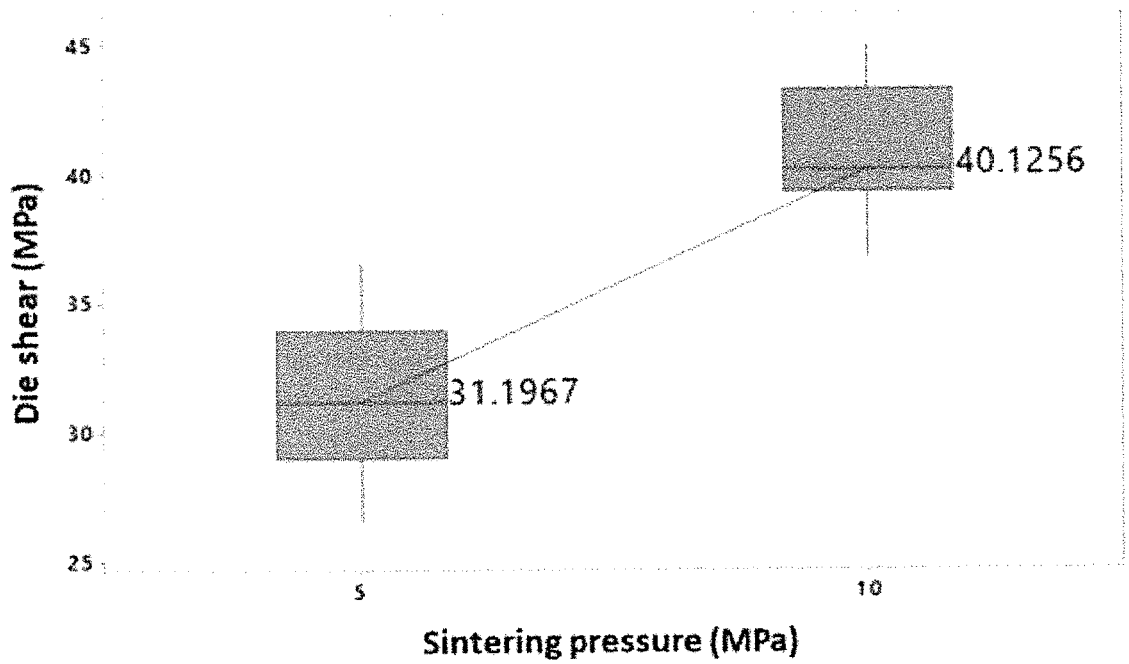
FIG. 4 shows boxplots of die shear at sintering temperature 250° C., at different pressures.

FIG. 4 shows boxplots of die shear at sintering temperature 250° C., at different pressures. In FIG. 4, the first temperature, pressure and time sintering conditions were 250° C., 5 MPa and 3 minutes, respectively. The second temperature, pressure and time sintering conditions were 250° C., 10 MPa and 3 minutes, respectively. The die shears at 5 MPa and 10 MPa sintering pressure, were about 31 MPa and about 40 MPa, respectively.

Example 6

Process for Free Standing Film

Free standing copper film was made using a Carver press. The casted film was pressed over a silicon wafer at 5 to 10 MPa pressure at 200° C. The dwell time was around 2 minutes. The copper film took the shape of the silicon wafer and did not diffuse into the silicon which, in turn, results in the detachment of the film from the polymeric substrate, resulting in a free standing film of around 30 to 40 μm thickness. The conductivity of the nanocopper film when a 9V battery was connect across the film resulted in the glow of an LED. The electrical resistivity of the film was found to be $2 \times 10^{-8}$ Ω·m.

Example 7

Nanocopper Paste Die Attachment Using Pressure Sintering

The attachment of semiconductor or other die elements can be accomplished by printing the nanocopper paste onto the substrates, such as direct bond copper (DBC), direct plate copper (DPC), metal core printed circuit boards (MCPCB), FR4, copper lead-frames, flexible PCBs, followed by drying the printed area by heating the printed substrate at 60° C. for 20 minutes. The process is then followed by die placement via a die bonder or a pick and place machine, and sintering in Carver press using pressure sintering.

The joint strength of the sintered copper joints was evaluated on DBC using a 3 mm*3 mm silicon gold coated die using a sintering pressure of 5 MPa and 10 MPa, for a sintering time of 3 minutes and 5 minutes and at 200° C. and 250° C. sintering temperatures, respectively. After the die placement, the entire assembly was then covered with an aluminium foil, which would prevent the oxidation of copper. Cushioning effect was provided using a graphite sheet of 0.5 mm thickness kept above the silicon die. It was observed that at a lower sintering pressure (5 MPa) and temperature (with a sintering time of 3 minutes), the joint strength was less as compared to higher sintering pressure and temperature.

The effect of different sintering temperature and pressure on the joint strength was tested. The results are summarised below in Table 3. Table 3 shows the effect of different sintering temperature and pressure on the joint strength. It is noted that, at higher sintering temperature and time, most of the dies shatter which reveals the fact that the joint strength is too good to shear the die from the substrate. Moreover, it also reveals strong diffusion of copper on both the interfaces.

TABLE 3

| Sintering time (minutes) | Sintering temperature (° C.) | Sintering pressure (MPa) | Die shear (MPa) |
|---|---|---|---|
| 3 | 200 | 5 | about 19 |
| 3 | 200 | 10 | about 29 |
| 3 | 250 | 5 | about 32 |
| 3 | 250 | 10 | about 39 |
| 5 | 200 | 5 | about 28 |
| 5 | 200 | 10 | about 43 |
| 5 | 250 | 5 | about 31 |
| 5 | 250 | 10 | about 45 |

Figure 5:
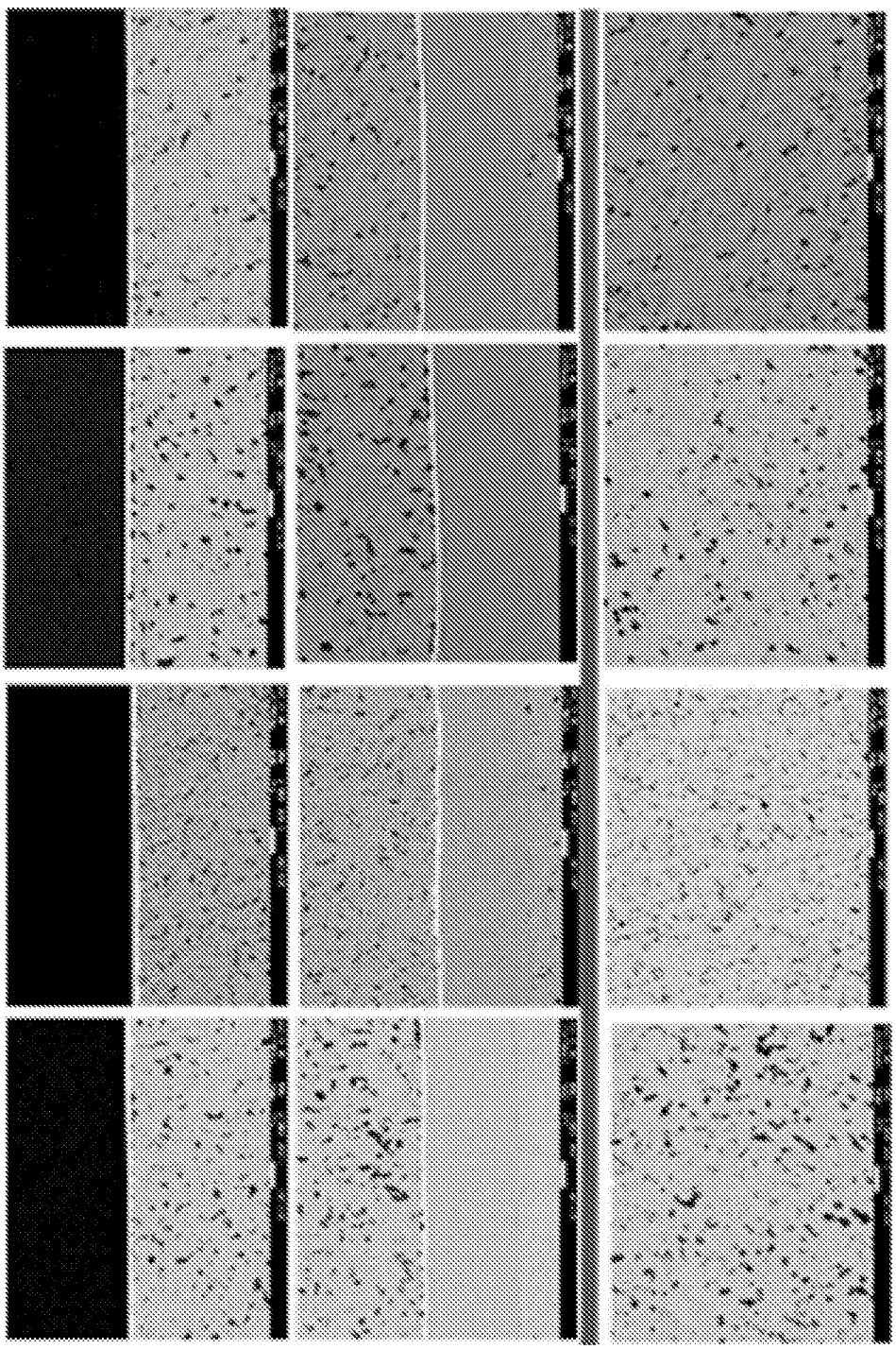
FIG. 5 shows SEM cross-section images after die attachment using pressure sintering, at 250° C. and different time and pressure sintering conditions.
Figure 6:
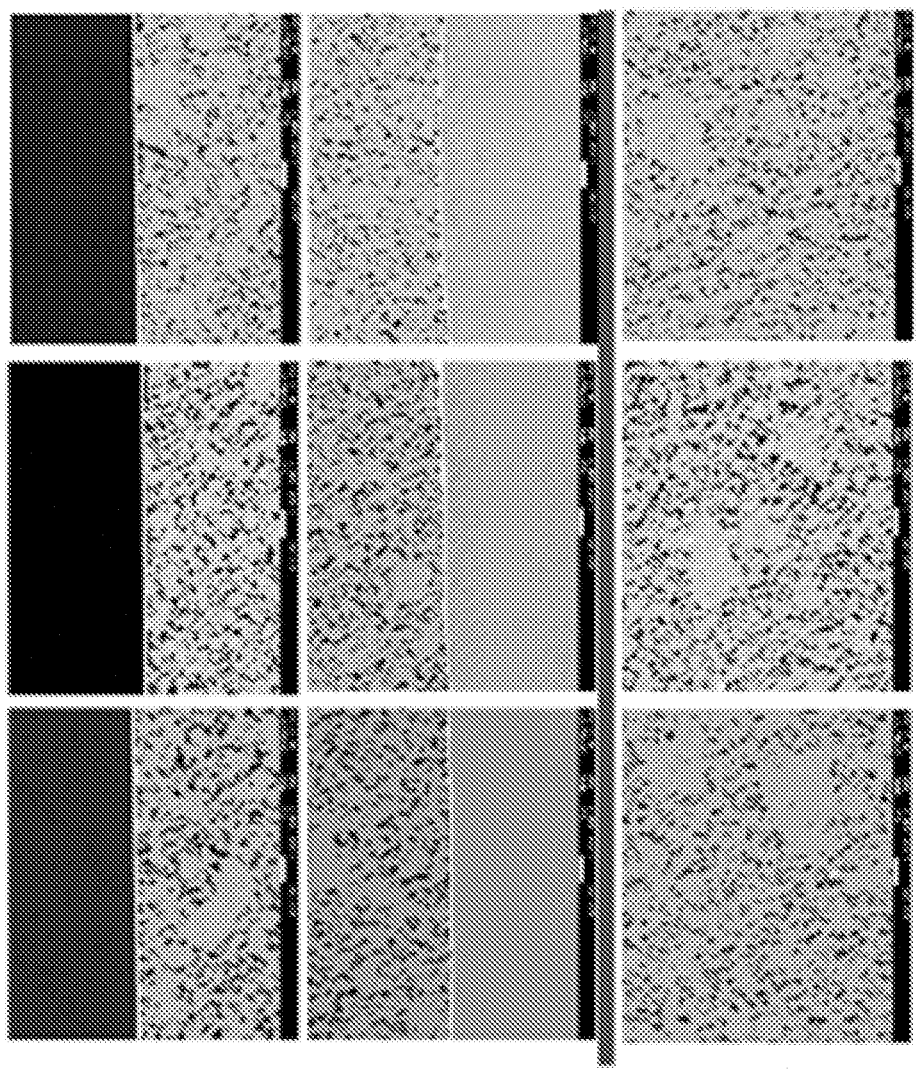
FIG. 6 shows SEM cross-section images after die attachment using pressure sintering, at 200° C. and different time and pressure sintering conditions.

The diffusion of copper on the interfaces is also confirmed by SEM cross section, which shows a very good densification of copper nanoparticle within the sintered layer and excellent diffusion of the nanoparticle on both the interfaces resulting in a bulk failure. It is clearly seen that the diffusion and densification of copper nanoparticle at 10 MPa is much better than 5 MPa sintering pressure. This can be seen in the SEM cross-sections in FIGS. 5 and 6. In FIG. 5, the top two rows of cross-section images show interface comparisons;

the top row being a die-copper layer interface and the middle row being a copper layer-substrate interface. The bottom row of cross-section images shows a microstructurel comparison of the copper layer. Each column of cross-section images exemplifies a different set of time and pressure sintering conditions. The sintering pressure in the first and second columns, and in the third and fourth columns were 5 MPa and 10 MPa, respectively. The sintering time in the first and third columns, and in the second and fourth columns, were 3 and 5 minutes, respectively. In FIG. 6, the top two rows of cross-section images show interface comparisons; the top row being a die-copper layer interface and the middle row being a copper layer-substrate interface. The bottom row of cross-section images shows a microstructurel comparison of the copper layer. Each column of cross-section images exemplifies a different set of time and pressure sintering conditions. The sintering pressure in the first column, and in the second and third columns were 5 MPa and 10 MPa, respectively. The sintering time in the second column, and in the first and third columns, were 3 and 5 minutes, respectively.

Attachment of such semiconductor and die elements can also be accomplished by DTF and lamination on the die backside made from the said material, followed by die placement and sintering using pressure.

The main advantage of the wafer lamination is the elimination of screen printing which is an added advantage in terms of machineries and man power. The diced copper coated silicon wafer was then singulated using a dicing machine and were attached to DBC using Carver press at 10 and 5 MPa pressure for 3 minutes. It was observed that the die shear was around 30 to 40 MPa respectively.

It was observed that at 10 MPa pressure, most of the silicon dies shatter which again proves excellent bond strength of the die to the substrate. Without being bound by theory, it is considered that with the increase in sintering pressure, the nanoparticles increasingly come into contact with each other which, in turn, increases the contact point of the nanoparticles resulting in better fusion of the particle giving excellent joint strength.

Example 8

Nanocopper Paste Adhesion on Ceramic, FR4 and PET Substrates

The nanocopper paste was tested for adhesion on ceramic, FR4 and PET. The paste was printed on various substrates using DEK printer and then cured at 1700° C. under nitrogen in a box oven for 30 mins. The print was then tested by typical scratch-adhesive tape test method. The adhesion to ceramic and FR4 was classified as 5B whereas adhesion to PET was classified as 4B.

Example 9

Screen Print and Soldering

The synthesized nanocopper paste also has the ability to be screen printed. The paste was screen printed with a mesh screen. Design patterns were made using a screen of mesh size of 70 in a DEK printer.

The screen-printed nanocopper pattern was then electroless nickel immersion gold (ENIG) coated followed by soldering with standard solder paste. The soldering showed very good spread but mid chip solder balls were seen at some places.

Furthermore, the possibility of soldering on copper print printed by the synthesized nano copper paste on bare FR4 coupon has been explored. The soldering on nanocopper was undertaken with a standard solder paste. Soldering without ENIG coating on the copper print also showed a good spread and good soldering features.

The foregoing detailed description has been provided by way of explanation and illustration, and is not intended to limit the scope of the appended claims. Many variations in the presently preferred embodiments illustrated herein will be apparent to one of ordinary skill in the art and remain within the scope of the appended claims and their equivalents.

The invention claimed is:

1. A method of forming a joint between two or more work pieces, the method comprising:
providing two or more work pieces to be joined,
providing a sintering paste in the vicinity of the two or more work pieces, the sintering paste comprising a sintering powder comprising copper particles, wherein the particles are at least partially coated with a capping agent, the particles exhibit a D10 of greater than or equal to 100 nm and a D90 of less than or equal to 2000 nm, the sintering powder comprises up to 1 wt. % of the capping agent, and the capping agent comprises triethanolamine,
drying the sintering paste, and
heating the sintering paste to at least partially sinter the copper, wherein the sintering paste is screen-printed onto one or more of the work pieces to be joined to form a screen-printed pattern, and solder is applied to the screen-printed pattern.

2. The method of claim 1, wherein the sintering powder comprises from 0.1 to 0.5 wt. % of the capping agent.

3. The method of claim 1, wherein the particles exhibit a D90 of less than or equal to 1000 nm.

4. The method of claim 1, wherein the two or more work pieces comprise a die and a substrate.

5. The method of claim 1, wherein the drying is carried out at a temperature of from 30 to 100° C. from 1 to 60 minutes.

6. The method of claim 1, wherein a pressure of from 2 to 18 MPa is applied during the step of heating.

7. The method of claim 1, wherein:
the screen-printed pattern is coated by an electroless nickel immersion gold (ENIG) technique prior to the solder being applied.

8. The method of claim 1, wherein the particles exhibit a D10 of greater than or equal to 125 nm and a D90 of less than or equal to 450 nm.

* * * * *